Figure 1:
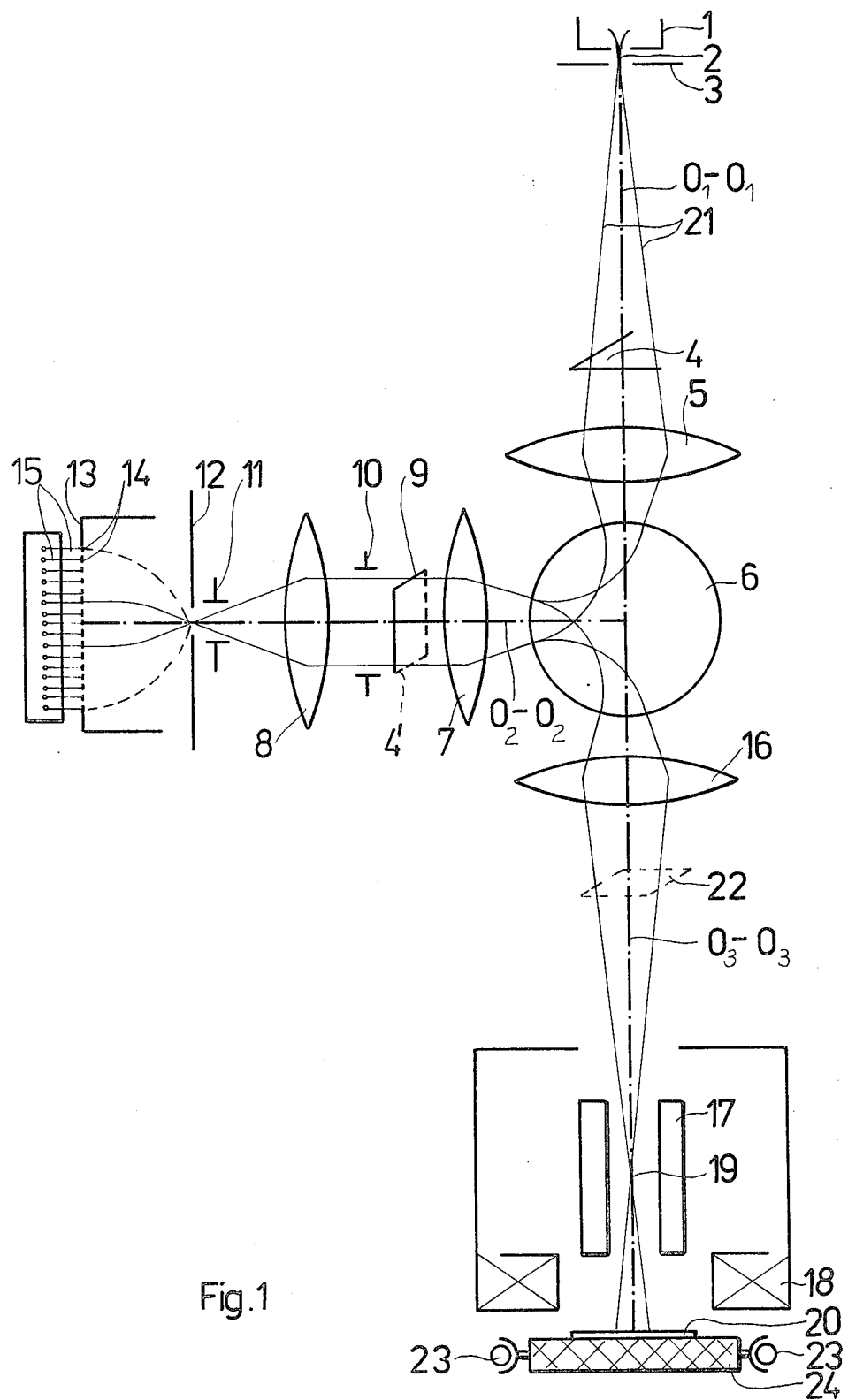

United States Patent [19]

Hahn

[11] Patent Number: 4,472,636
[45] Date of Patent: Sep. 18, 1984

[54] METHOD OF AND DEVICE FOR CORPUSCULAR PROJECTION

[76] Inventor: Eberhard Hahn, 9 Pestalozzistrasse, Jena, District of Gera, German Democratic Rep.

[21] Appl. No.: 202,046

[22] Filed: Oct. 30, 1980

[30] Foreign Application Priority Data

Nov. 1, 1979 [DD] German Democratic Rep. ... 216600
Oct. 1, 1980 [DD] German Democratic Rep. ... 224257

[51] Int. Cl.³ .......................................... H01J 37/302
[52] U.S. Cl. .................................. 250/492.2; 250/398
[58] Field of Search ............. 250/492.2, 492.3, 396 R, 250/396 ML, 398

[56] References Cited

U.S. PATENT DOCUMENTS

| | | | |
|---|---|---|---|
| 3,278,679 | 10/1966 | Newberry | 328/121 |
| 3,832,561 | 8/1974 | O'Keeffe | 250/492.2 |
| 4,075,488 | 2/1978 | Okayama et al. | 250/396 R |
| 4,130,761 | 12/1978 | Matsuda | 250/492.2 |
| 4,418,283 | 11/1983 | Trotel | 250/398 |

Primary Examiner—Alfred E. Smith
Assistant Examiner—Carolyn E. Fields

[57] ABSTRACT

The invention relates to a method of and device for producing any desired patterns on a target. The irradiating beam is modulated over the entire cross-sectional area by an electro-magnetic field, which is obtained by a line or two-dimensionally shaped electrode grid, each individual electrode of which can be differently charged and which reflects the irradiation beam or produces a respective strip.

4 Claims, 4 Drawing Figures

METHOD OF AND DEVICE FOR CORPUSCULAR PROJECTION

The invention relates to a method of and a device for corpuscular projection, in particular, for an electron irradiation of a target to produce an irradiation pattern, in which an irradiation beam is limited in its cross-section, structured in its intensity and focussed and deflected by electro-magnetic fields.

Heretofore, in the course of an electron beam processing a target is linewise scanned by an electron probe. Depending on whether the electron probe scans an area to be irradiated or not the beam is blacked out by deflection or not. This arrangement is disadvantageous since the black-out time can be a multiple of a scanning time. This disadvantage is obviated when using a mask the pattern of which is electron irradiated and imaged upon a target. This method, however, is disadvantageous since each pattern requires an individual mask which has to be adjusted in the electron beam and thus cannot cope with numerous patterns.

In a further known method a pattern to be irradiated is composed of a plurality of referably rectangular sub-areas of different size and shape, the position, shape and size of the sub-areas is controlled through deflection fields which affect the electron beam. Due to the times required for data selection, transfer, digital-to-analog conversion and beam deflection a considerable dead-time is involved in irradiating a target so the output of such a device is limited.

In a further known method for electron beam irradiation a number of beam cross-section is ready for use, adjustable according to size and shape, out of which one is selected for irradiation a target. Thus a higher output is obtained for slanting and circular cross-section, but the dead-times in the course of an irradiation process still remain due to the access times to the individual cross-sections. There are already known electron microscopes using magnetic prisms and electron reflectors. The electron reflectors are provided with a potential applied to the reflector as a whole. Finally, an electron microscope is known which focusses an electron beam as a line upon an object and upon an image substrate by means of quadrupole lenses. The structure of the object causes a structuring of the electron beam and, hence, of the line probe. The object can be considered as a grid of transparent and opaque elements which has the effect of a mask.

Since the line probe cannot be programmed at will a high output is not obtained. Furthermore, the access-time to a structure contained in a number of structures is considerable apart from the use of D/A converters required.

It is an object of the present invention to obviate the above disadvantages. It is a further object of present invention to provide a method of and a device for corpuscular irradiation, in particular, for electron beam irradiation which permit the production of any desired pattern on a target substantially without any delay time by modulating the entire cross-sectional area of an electron beam. The electron beam area can be programmed at will.

These and other objects are realised by at least one additional electromagnetic field which is controllable and which structurises the intensity of the cross-sectional area of an electron beam. Thus it is feasible to obtain any desired intensity distribution of the cross-sectional area of a corpuscular beam and considerably short processing times when irradiating targets to produce structured objects. The invention can be used with advantage in the production of integrated circuits, in particular in resistor elements. The shape of the beam cross-section and the kind of the field (electric or magnetic) is irrelevant to the operation of the invention.

The beam cross-section can preferably be rectangular or linear.

The inventional method is realised by a device in which a radiation source is imaged via a deviating prism into the object side focal plane of an electron reflector where it is reflected and imaged via the deviating prism into the entrance pupil of an objective, furthermore, beam limiting means are imaged upon the electron reflector and from there upon a target via a deviating prism and through the objective. The device is characterised in that the electron reflector has a reflecting surface constituted of a matrix, the individual matrix elements being electrically insulated from each other and applied to a power supply via electronic switches. Said matrix is controlled via a storage system. The electron reflector can have a multiple size of the electron beam cross-section. Thus it is feasible to employ a part of the electrodes to expose the target while the other part of the electrodes is charged.

Depending on the electrode potential, for example 0 to 10 volt to the cathode potential, the electrons are reflected or absorbed and thus the cross-sectional area of the electron beam is structurised. To eliminate stray-effects at least one aperture is arranged in the vicinity of the object side focal plane of the electron reflector. A further embodiment of the invention for eliminating stray-effects and, hence, intensity losses stigmatically images a radiation source into a first and a second real focal line through quadrupole lenses. A lens arrangement stigmatically images a first focal line upon a target. Said embodiment is characterised in that the second focal line is adjusted to the opening of a slit aperture and that at least one line-shaped electrode arrangement referred to hereinafter as electrode strip is located in parallel and adjacent to the first focal line. The individual electrodes of the electrode strip are electrically insulated from each other and connected to a voltage source via electronic switches, which are controlled by a storage. Thus cross-talk interferences are eliminated.

Advantageously, the electrode strip is arranged along an edge of a semiconductor chip, the individual electrodes projecting from out of the edge.

The semiconductor chip can be provided with integrated circuits produced by microlithographic procedures. Such integrated circuits and multipley arrangements considerably reduce the expenditures in control lines between the electrodes and the data outputs of a dynamic storage in dependence of the clock-pulse-frequency on the exposure frequency of the target. Adjacent the first focal line a second electrode line can be arranged in opposition thereto which is charged when the first electrode line is involved in exposing the target. It is a further advantage when the electrodes are considerably thin and, hence, can be produced by microlithographic procedures. Still a further advantage is obtained when the lenses of the irradiation arrangement are also quadrupole lenses.

Figure 2:
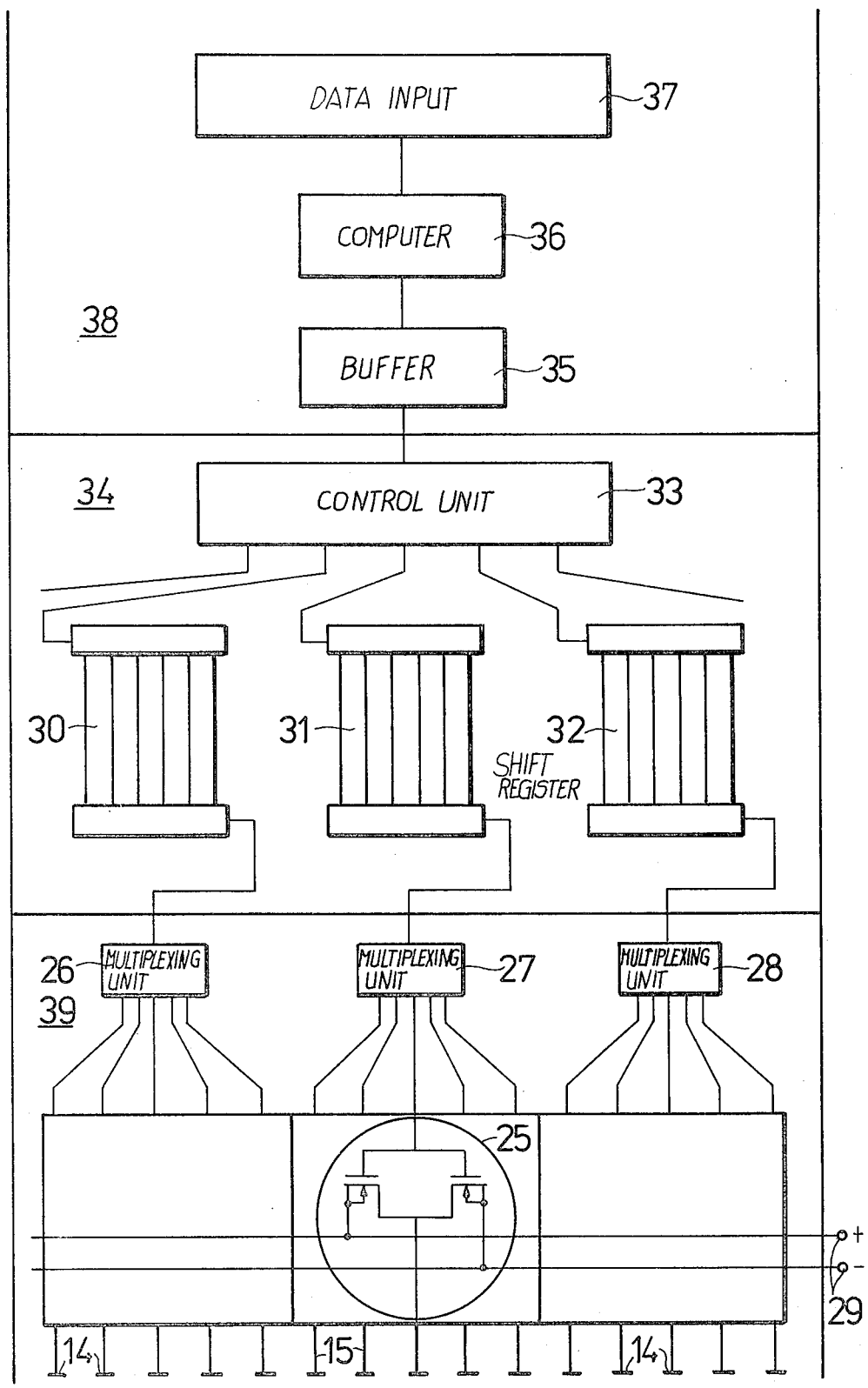
Figure 3:
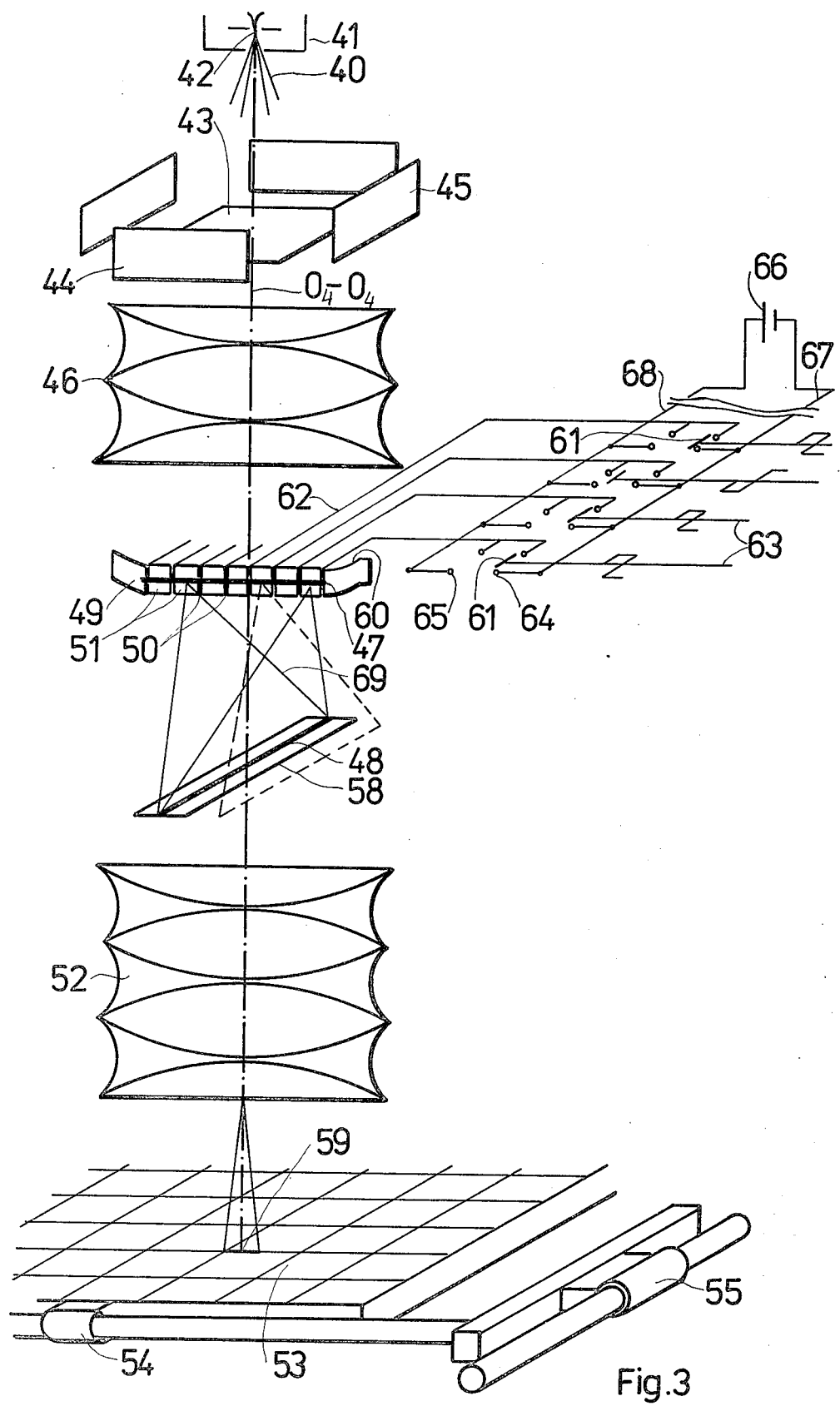
Figure 4:
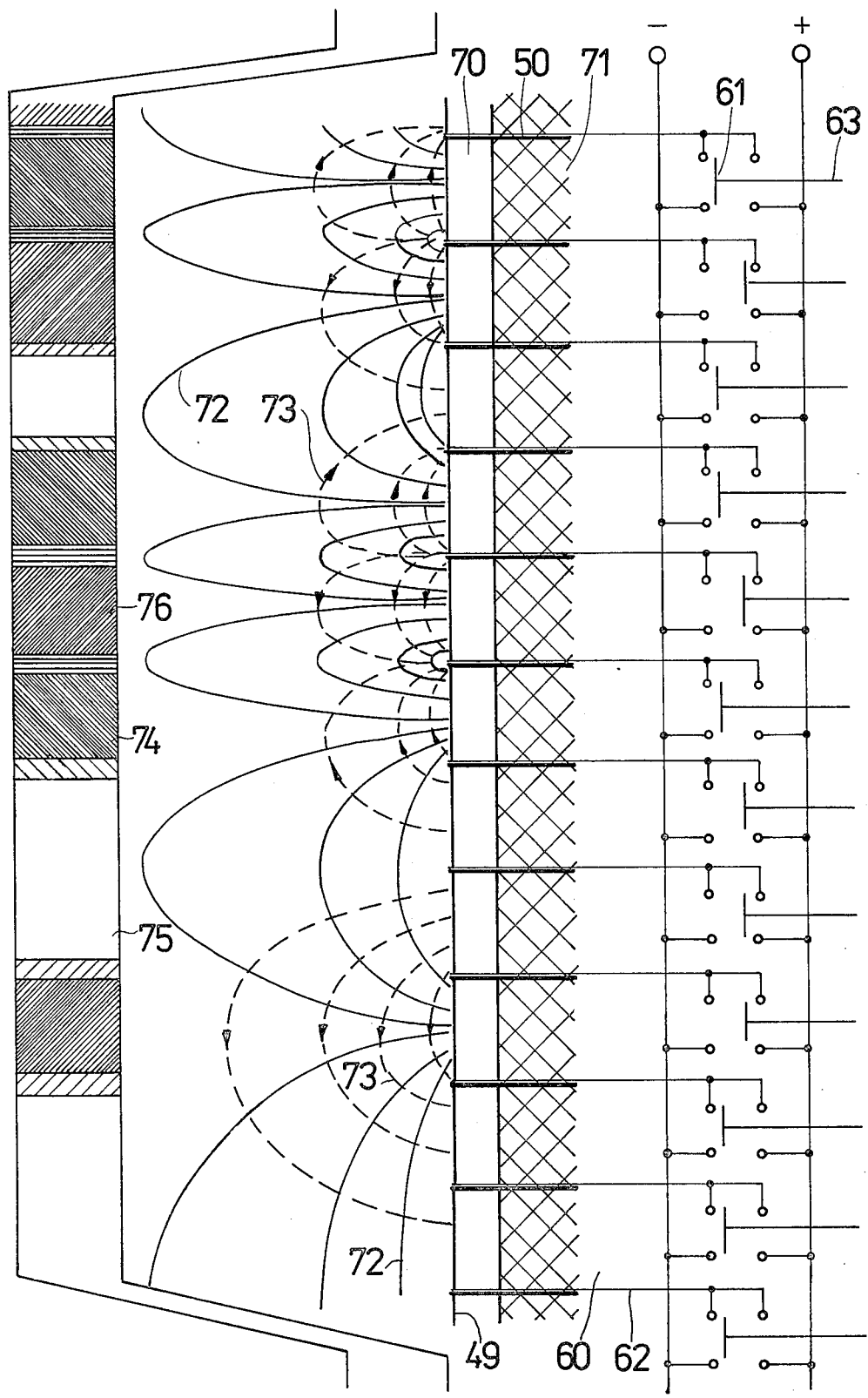

In order that the invention may be more readily understood reference is made to the accompanying drawings which illustrate diagrammatically and by way of example two embodiments thereof and where FIG. 1 is a schematic view of an electron beam irradiation device, FIG. 2 an schematical view of the electronic circuit for the device of FIG. 1, FIG. 3 a schematic view of a further electron beam irradiation device, and FIG. 4 a schematic representation of the field distribution of an electrode strip.

In FIG. 1 an electron gun 1 with a cross-over 2 is followed by an aperture 3, an angular aperture 4, a condenser 5 and a magnetic deviating prism 6. The latter is constituted of two opposing pole pieces of circular cross-section which are connected by an iron circuit which, in turn, is provided with the excitation coils (not shown).

The iron circuit is opposed by an electron optical system 7, 8, the pole pieces are opposing each other considered at right angles to an axis $0_2$—$0_2$.

The optical axis $0_2$—$0_2$ of the electron-optical system 7, 8 (condenser lenses 7, 8) does not coincide with an optical axis $0_1$—$0_1$ of the condenser 5, both axes include an angle of 90° in the FIG. 1 embodiment.

An angular aperture 9 and a deflection system 10 are provided between the condenser lenses 7 and 8. A further electron-optical deflection system 11 is arranged subsequent to the electron-optical system 7, 8 in optical alignment to the electron-optical axis $0_2$—$0_2$.

The deflection system 11 is followed by a stray-radiation aperture 12 and an electron reflector 13, the reflecting surface of which carries a matrix of electrodes 14, the outputs 15 of said electrodes 14 are connected via electronic circuits 25 to multiplexing units 26, 27, and 28 (FIG. 2). The stray radiation aperture 12 is located in the plane of an intermediate pupil (not shown).

A further condenser 16, a deflection system 17, a deflection electron-optical objective 18 with an intermediate image plane 19 are arranged about an optical axis $0_3$—$0_3$ which is the extension of the optical axis $0_1$—$0_1$. A target 20 is arranged subsequently to the intermediate image plane 19 upon a slide 24 displaceable in guides 23 at right angles to the drawing plane. The deflection systems 10, 11 and 17 and its operation are well known in the art (i.e. German specification No. 2 105 455).

In operation, a bundle of beams 21 emitted by the electron gun 1 is firstly shaped by the angular aperture 4 and focused asymptotically through the condenser 5 upon the center of the deviating prism 6, which folds the bundle of beams 21 about 90° which is then in alignment with the optical axis $0_2$—$0_2$. The angular aperture 4 is imaged into the plane of the angular aperture 9 where it appears as a complementary image 4' to the aperture 9. The angular apertures 4 and 9 are so adjusted that the bundle of beams 21 has a square shape in the plane of the angular aperture 9. The condenser 5 and the condenser lens 7 constitute a telescope system to image the angular apertures 4 and 9 one upon the other. The condenser lens 8 images the beam cross-section shaped by said angular apertures 4 and 9 upon the electron reflector 13. A potential is applied to the individual electrodes 14 of the electron reflector 13 according to a predetermined schedule, in voltage steps of from 0 to 10 volt so that the electrons of the beam 21 are correspondingly stopped, reflected and accelerated within the electric field in front of the reflector.

The arrangement is so constructed that an intermediate image of the cross-over 2 is produced in the focus of the electron reflector 13, in the plane of the stray radiation aperture 12. Thus the beams 21 perpendicularly impinge upon the reflector surface and are back reflected in themselves. Since the surface of the reflector 13 is structurised through the electrode matrix the reflection is not an ideal one, that is, a considerable stray radiation occurs. The stray radiation aperture 12 substantially eliminates such a stray radiation.

The bundle of beams 21 reflected at the reflector 13 produces an intermediate image of the shaped beam cross-section through the condenser lens 8 in the plane of the angular aperture 9 and, after folding in the deviating prism 6, a like intermediate image 22 through the condenser 16 in a plane before the deflection system 17 of the deflection objective 18. The cross-over 2 is once again imaged through the condenser 16, namely, into the entrance pupil 19 of the deflection objective 18, which, in turn, produces an image of the shaped and intensity structurised beam cross-sectional area with a high current intensity and aberationless upon the target 20, structurised due to the different potentials applied to the electrodes 14 of the electron reflector 13. The deflection system 17 displaces the image of the beam cross-sectional area in the plane of the target 20 so that other target ranges can be irradiated. The invention is not restricted to the 90° folding of the bundle of beams 21 by the deviation prism 6 as disclosed in connection with FIG. 1. The cross-sectional shape of the bundle of beams can be another one, namely, a rectangular or a linear one.

To this end a plate capacitor has to be inserted into the slit between the pole pieces of the deviating prism 6, the electric field strength of said capacity in parallel to the magnetic field strength, both field intensities being adjustable. In order to re-produce a defined and set pattern the surface of the electron reflector 13 can be topographically prepared in mask-like manner.

It is also possible to subdivide the electron reflector 13 in at least two fields, one for affecting the bundle of beams 21, the other in the state of changing over the electrodes to affect the bundle of beams. The deflection system 17 determines the sequence of operation of said two fields.

The electron reflector can also be curved, however, a plane reflector is easier to produce.

The condenser lenses 7 and 8 can be quadrupole systems including deflection systems and cylinder lenses.

In FIG. 2 electrodes 14 are provided with conducts 15 connected to electronic circuits 25 such as CMOS ICs which are connected to multiplexing units 26 27, and 28, respectively, which, in turn, control the potential of a voltage source 29. The multiplexing units 26, 27, 28 are each connected to a respective shift-register 30, 31, and 32. The latter are connected to a control unit 33 for controlling the shift registers. The shift registers 30, 31, 32 and the control unit 33 constitute a dynamic storage 34. The control unit 33 is followed by a buffer 35, a computer 36 and a data input unit 37 which constitute a unit 38 or data input. The electrodes 14, the electronic circuit 25 and the multiplexing units 26, 27, 28 can be arranged on a common panel 39 which constitute an integral unit with the electron reflector 13 (FIG. 1). The data corresponding to the irradiation pattern desired are fed into the data input 37. The computer 36 converts said data into binary digits which are fed into the buffer 35. The control unit 33 feeds the data into the parallel connected shift registers 30, 31, 32 in the dynamic storage unit 34, each shift register having an equal number of k elements. Each dynamic storage unit has i parallel shift registers including input and output registers of i storage elements.

The bit sequence is fed with a high frequency i×f into the input register where it is transferred into the parallel registers which are passed with a i times lower clock pulse frequency f. The bit sequence is once again transferred into the output register and fed with a high clock-pulse frequency to the respective multiplexing unit 26, and 27, respectively 28. In the latter the bit sequence is successively distributed to the i circuits and controls the binary potential of i electrodes of an electrode group of the electron reflector (FIG. 1). The reading cycle can be k times repeated until the informations in the shift registers 30, 31, 32 are processed.

With m dynamic storage unit m times i electrodes are charged by the clock-pulse frequency f. The storage units have a capacity of m×i×k bits, which suffices to produce one pattern in the target. To produce a target n patterns are required.

Therefore, n×m storage units have to be provided which can selectively and individually connected to the multiplexing units via a not shown control unit.

In FIG. 3 an electron gun 41 with a cross-over 42 is followed by a first beam limiting aperture 43 (field aperture) and a deflection unit 44, 45, arranged in two directions at right angles to each other and to an optical axis $0_4$—$0_4$. The electron gun 41 emits an electron beam 40.

A first quadrupole electron lens 46 shapes the electron beam 40 astigmatically into two real focal lines 47, 48 which are at right angles to each other.

A strip of electrodes 49 is arranged in parallel to and adjacent the first focal line 47. The individual electrodes 50 are small straps which protrude from out of an insulating material 51 separating the individuals straps from one another. A slit aperture (selecting aperture) 58 is arranged in parallel to the second focal line 48. A second quadrupole lens 52 is coaxially arranged to an optical axis $0_4$—$0_4$ and stigmatically images the first focal line as a dashed-line probe 59 upon the target 53, which is displaceable in two directions at right angles to each other by means of a crossslide system 54, 55. The electrode strip 49 is located at the small side of a semiconductor wafer 60 upon which an electronic circuit 61 and the respective connection lines 62 from the electrodes 50 to the electronic circuit 61 are arranged. Furthermore, a signal line 63 connects the electronic circuit 61 to a not shown control electronic unit (FIG. 2).

Two further terminals 64, 65 of each electronic circuit 61 are connected to a voltage source 66 via conducts 67, 68 of the binary potential. Depending on the control signal the respective binary potential is applied across the electrode 50. The beam 40 emitted via a cross-over 42 evenly illuminates the beam limiting aperture 43 and is shaped to a beam composition 69 due to the astigmatic imaging and which is extended through the focal lines 47 and 48. The length of the two focal lines 47 and 48 is determined by the astigatic image of the beam limiting aperture 43, and the width through the astigmatic image of the cross-over 42. The focal lines 47 and 48 are at right angles to the optical axis $0_4$—$0_4$, the meridional planes are optically at right angles to each other. The deflection means 44 adjusts the distance of the focal line 47 to a central line of the electrode strip 49.

The deflection means 45 serves to displace the focal line 48 in a cross-direction and hence to adjust it to the center of the slit aperture 58. The plane of the focal line 47 at right angles to the optical axis $0_4$—$0_4$ is stigmatically conjugate to the plane of the target 53, hence an image of the focal line 47 in the target plane, namely a line probe results when the focal line 47 is so adjusted that the beam 40 is passed through a full-stop. When the focal line 47 is brought into the vicinity of the electrode strip 49 through the deflection means 44, and, hence the focal line 47 and the electron beam 40 are subjected to the effect of the different potentials applied to the individual electrodes 50 then an intensity differing along the focal line 47 results.

When, for example, a different potential is applied to two adjacently located electrodes 49 which define an interval of the focal line 47, an electric field is built up between them deflecting the partial beam composition upon the edge of the slitaperture 58, perpendicularly to the base as shown in FIG. 3 in dashed lines. The concerned partial beam composition is defined by the interval, which is the vertex and the focal line 48 which is the base. The image of the line probe 59 conjugate to the interval of the focal line 47 is blacked-out. The binary radiation structure, namely, a definite sequence of bright and dark intervals produced upon the line probe 59 in the target plane reproduces a corresponding latent irradiation structure upon the target, for example, a resistor structure in the course of the irradiation period which is matched to the resistance and the probe current intensity. When the line probe 59 after irradiation of a target section covers another one by displacing the target 52 by operation of the cross-slides 54, 55 the binary potential of the individual electrodes 50 is varied through the control electronic system (Fig.2) and, hence, the irradiation structure in the line probe 59. Dead times are substantially eliminated since the charging of the electrodes require less time than the irradiation operation. To this end signal lines 63 connect the not shown control electronic system to the electronic circuits 61 via a not shown bit parallel and word serial storage system as, for example, specified in Möschwitzer, Jorke: "Mikroelektronische Schaltkreise, VEB Verlag Technik Berlin 1979, pages 172 to 175, and via multiplexing units (FIG. 2).

The quadrupole lenses 46 produce the two focal lines 47, 48. The deflection sensitivity is great measured at the bright-dark control of a partial bundle of beams originating from an interval of the focal line 47 in the course of deflection in the plane defined by the beam incidence direction and the focal line 47; and the deflection sensitivity is small at a deflection at right angles to said plane.

It is feasible to construct a quadrupole lens system composed of two quadrupole lenses in which in each quadrupole lens two image planes astigmatically conjugate to a first object plane are commonly astigmatically conjugate to a second optically different object plane. Such a quadrupole lens system permits stigmatically to image the focal line 47 upon the target 53. In addition thereto, such a quadrupole lens system has intermediate image planes of the stigmatic and astigmatic images in which the deflection centers of deflection means are located which are required to adjust the bundle of beams 40.

In FIG. 4 a portion of an electrode strip (FIG. 3) is represented enlarged in top view. The strap like electrodes 50 are connected via lines 62 to the electronic circuits 63 (FIG. 3).

The electrodes 50 are separated from each other by a semiconducting layer material 70, silicon, for example, beneath which an insulating layer 71 ($SiO_2$) is provided, which also contains the lines 62. Both layers are mounted on a substrate 60 and are protected against ambience by a not shown covering means.

The substrate 60 has a width of about 100 μm to 200 μm, the electrode width about 0.1 μm and the mutual space between the neighboring electrodes amounts to a few μm. The potential applied to the terminals is designated + (plus) and − (minus). When a different potential is applied across two neighboring electrodes an electric field builds up with equipotential lines 72 and field strength lines 73 (dashed lines). The direction of force of said lines is indicated by arrows.

The gradient of the field produced by the electrode strip 49 is in parallel to the electrode strip 49 in the range 51 between the electrodes 50, when there is a potential drop. In the ranges without a potential drop the respective gradient is perpendicular to the electrode strip 49. The direction of the gradient (field strength) is independent on the binary potential (pattern) in the other ranges. The intensity of the gradient in ranges without potential differences decreases with increasing distance to the range of different potential. The shaped beam 40 (FIG. 3) is only influenced in the plane of the electrode line 49 by those field strength components which are in parallel to said electrode line 49. In a not shown focal line (47 in FIG. 3) produced in the vicinity of the electrode line 49, those field ranges become effective in which the field lines are curved. The current controlled field strength components are attenuated in the ranges of different potential and cross to neighboring ranges without potential differences. The slope of contrast is flattened where two differently controlled image intervals collide. The contrast behaviour corresponding to the field line pattern is shown in the range 74 of the focal line, which for reason of simplicity is shown displaced. The dark-bright controlled sections 75 and 76, respectively, are very distinctly shown. Anyway the signal character is maintained.

The inventional arrangement is not restricted to the above embodiments. So two electrode strips in parallel and opposition to each other and to the focal line 47 can be arranged, one of the strips being in the control operation when the other is charged.

I claim:

1. Device for corpuscular projection for electron irradiation of a target in which a radiation source is astigmatically imaged through a quadrupole lens into a first and a second real focal line, and in which the first focal line is stigmatically imaged via a lens arrangement upon a target, characterised in that the second focal line is adjusted upon an opening of a slit aperture, and in that at least one strip of electrodes is arranged in parallel to and adjacent the first focal line, the individual electrodes of the strip of electrodes being mutually insulated and connected to a voltage source via electronic switches, controlled by a storage.

2. Device as claimed in claim 1, wherein the electrodes are arranged along the edge of a semiconductor wafer and protrude from out of said edge.

3. Device as claimed in claim 2, wherein said electrodes are thin compared to the space between neighboring electrodes.

4. Device as claimed in claim 1, wherein said lens arrangement is a quadrupole lens.

* * * * *